US Patent [19]  
Ballato

[11] Patent Number: 4,871,986  
[45] Date of Patent: Oct. 3, 1989

[54] METHOD OF MAKING A CRYSTAL OSCILLATOR DESENSITIZED TO ACCELERATIONFIELDS

[75] Inventor: Arthur Ballato, Long Branch, N.J.

[73] Assignee: The United States of America as represented by the Secretary of the Army, Washington, D.C.

[21] Appl. No.: 268,829

[22] Filed: Nov. 4, 1988

[51] Int. Cl.$^4$ .......................... H03B 5/04; H03B 5/32
[52] U.S. Cl. ............................ 331/158; 331/107 A; 331/175
[58] Field of Search ................ 331/65, 107 A, 116 R, 331/116 FE, 158, 175

[56] References Cited

U.S. PATENT DOCUMENTS 4,100,512  7/1978  Valdois et al. ........................ 331/158
4,344,010  8/1982  Vig et al. ........................ 331/175 X
4,575,690  3/1986  Walls et al. ..................... 331/158 X Primary Examiner—Siegfried H. Grimm
Attorney, Agent, or Firm—Michael J. Zelenka; Roy E. Gordon

[57] ABSTRACT

An oscillator and a resonator included in the oscillator are operated at a frequency that is not the resonator frequency but that is off resonance at a frequency where the resonator has a minimum acceleration sensitivity and the desired oscillator output frequency is then electronically produced using electronic frequency synthesis techniques.

13 Claims, No Drawings

METHOD OF MAKING A CRYSTAL OSCILLATOR DESENSITIZED TO ACCELERATIONFIELDS

The invention described herein may be manufactured, used, and licensed by or for the Government for governmental purposes without the payment to me of any royalty thereon.

This invention relates in general to a method of making a crystal oscillator and in particular to a method of making a crystal oscillator desensitized to acceleration fields.

BACKGROUND OF THE INVENTION

In Ser. No. 243,538, filed Sept. 12, 1988 by Arthur Ballato for "Method of Making an Acceleration Hardened Resonator" and assigned to a common assignee, and with which this application is copending, a method is disclosed and claimed of making an acceleration hardened resonator. In Ser. No. 243,538, it is necessary to alter the physical characteristics of the resonator in order to effect the acceleration hardening or desensitization. It must be realized that these alterations add to the manufacturing costs. Thus, it would be desirable to make a resonator in the standard fashion without having to physically alter the crystal and produce the acceleration desensitization electronically.

SUMMARY OF THE INVENTION

The general object of this invention is to provide a method of making a crystal oscillator. A more specific object of the invention is to provide such a method wherein the crystal oscillator will have a desired output frequency and be desensitized to acceleration fields. Another object of the invention is to provide such a method without having to alter the crystal resonator that is to be used in the oscillator.

It has now been found that the aforementioned objects can be attained by operating the crystal resonator in an oscillator that has been adjusted so that the crystal resonator does not operate at its resonance frequency but at an offset frequency where its acceleration sensitivity is minimized.

More particularly, according to the invention, a method of making a crystal oscillator is provided having a desired output frequency and being desensitized to acceleration fields, the method including the steps of (A) manufacturing and mounting a crystal resonator to be included in said oscillator, (B) performing acceleration tests upon the resonator to determine the acceleration sensitivity variation as a function of frequency in the vicinity of the resonance frequency of the resonator, (C) including the resonator in the oscillator and operating the resonator and oscillator at a frequency that is not the resonator frequency but that is off resonance at a frequency where the resonator has the minimum acceleration sensitivity, and (D) electronically producing the desired oscillator output frequency using electronic frequency synthesis techniques.

DESCRIPTION OF THE PREFERRED EMBODIMENT

It is desired to make an acceleration insensitive crystal oscillator having an output frequency of 10 MHz for a communication device. Accordingly, a bulk acoustic wave (BAW) quartz crystal resonator is manufactured and mounted using standard methods of resonator manufacture. The resonance frequency of the resonator is found to be 9.900 MHz using an impedance bridge. The crystal resonator is then placed in a standard oscillator circuit of the Colpitts variety operating at 9.900MHz and its acceleration sensitivity measured on a shake table. The acceleration sensitivity, $\gamma_o$, is found to be $2 \times 10^{-9}/g$.

The frequency of the oscillator is then varied from 9.800 MHz to 10.000 Mhz by an arrangement of inductors and capacitors in the oscillator. During this variation in oscillator frequency, the acceleration sensitivity of the oscillator is continuously monitored and found to have the minimum sensitivity of $\gamma = 8 \times 10^{-10}/g$ at 9.910 Mhz. The oscillator components are now fixed so that the oscillator operates at 9.910 MHz. The crystal, therefore, is seen to be operated at a frequency off its resonance frequency. This is the frequency at which the minimum acceleration sensitivity or $\gamma$ is found to occur. Since however, the oscillator is desired to operate at 10.000 MHz, the 9.910 MHz output at which the acceleration sensitivity is at a minimum, is not directly acceptable. Therefore, the desired 10.000 MHz output frequency is electronically produced by frequency synthesis techniques well established in the art.

EXAMPLE 1

It is desired to make an acceleration insensitive crystal oscillator having an output frequency of 500 MHz for a radar receiver. Accordingly, a quartz crystal SAW resonator is manufactured and mounted using standard methods of resonator manufacture. The resonance frequency of the resonator is found to be 501.000 MHz using a network analyzer. The SAW crystal resonator is then placed in a pi network test fixture and the phase across the SAW device is measured by a vector voltmeter while the input is driven by a variable frequency synthesizer. It is found that the vector voltmeter reads zero phase, corresponding to the SAW resonance frequency, when the frequency source is 501.000 MHz. The test fixture containing the SAW resonator is now mounted on a shake table, and its acceleration sensitivity is measured over the frequency range from 499.000 MHz to 503.000 MHz. It is found that the acceleration sensitivity attains a minimum of $\gamma = 3 \times 10^{-10}/g$ at a frequency of 500.876 MHz. The SAW resonator is now incorporated into an oscillator circuit that is tuned to 500.876 MHz and fixed at that frequency. The crystal, therefore, is seen to be operated at a frequency off its resonance frequency, but at the frequency where the minimum acceleration sensitivity, $\gamma$, is found to occur. Since, however, the oscillator is desired to operate at 500.00 MHz, the 500.876 MHz output at which the acceleration sensitivity is at a minimum, is not directly acceptable. Therefore, the desired 500.000 MHz output frequency is electronically produced by frequency synthesis techniques well established In the art.

EXAMPLE 2

The method of Example 1 is repeated substituting a lithium niobate plate resonator for the quartz crystal resonator, and a Pierce oscillator is employed instead of a Colpitts for a sensor used to monitor the temperature of rotating machining operated at very high temperatures.

In this invention, the crystal resonator may be made of any suitable piezoelectric material such as quartz, lithium niobate, lithium tantalate, berlinite, gallium arsenide, polycrystalline zirconium titanate ceramics, and lithium tetraborate. The crystal resonator can also be a composite resonator such as a resonator made of silicon and zinc oxide. The resonator may be bulk acoustic wave (BAW), surface acoustic wave (SAW), or shallow bulk acoustic wave (SBAW).

The crystal oscillator can be of various types such as Colpitts, Butler, Pierce, Clapp, Miller and Meacham.

I wish it to be understood that I do not desire to be limited to the exact details as described for obvious modifications will occur to a person skilled in the art.

What is claimed is:

1. Method of making a crystal oscillator having a desired output frequency and desensitized to acceleration fields, said method including the steps of:
   (A) manufacturing and mounting a crystal resonator to be included in said oscillator,
   (B) performing acceleration tests upon the resonator to determine the acceleration sensitivity variation as a function of frequency in the vicinity of the resonance frequency of the resonator,
   (C) including the resonator in the oscillator and operating the resonator and oscillator at a frequency that is not the resonator frequency but that is off resonance at a frequency where the resonator has the minimum acceleration sensitivity, and
   (D) electronically producing the desired oscillator output frequency using electronic frequency synthesis techniques.

2. Method according to claim 1 wherein the crystal resonator is a piezoelectric material selected from the group consisting of quartz, lithium niobate, lithium tantalate, berlinite, gallium arsenide, polycrystalline zirconium titanate ceramics and lithium tetraborate.

3. Method according to claim 2 wherein the crystal resonator is a quartz resonator.

4. Method according to claim 2 wherein the crystal resonator is a lithium niobate resonator.

5. Method according to claim 2 wherein the crystal resonator is a lithium tantalate resonator.

6. Method according to claim 2 wherein the crystal resonator is a berlinite resonator.

7. Method according to claim 2 wherein the crystal resonator is a gallium arsenide resonator.

8. Method according to claim 2 wherein the crystal resonator is a polycrystalline zirconium titanate ceramic resonator.

9. Method according to claim 2 wherein the crystal resonator is a lithium tetraborate resonator.

10. Method according to claim 1 wherein the crystal resonator is a composite of silicon and zinc oxide.

11. Method according to claim 1 wherein said crystal resonator is a bulk acoustic wave (BAW) resonator.

12. Method according to claim 1 wherein said crystal resonator is a surface acoustic wave (SAW) resonator.

13. Method according to claim 1 wherein said crystal resonator is a shallow bulk acoustic wave (SBAW) resonator.

* * * * *